United States Patent [19]

Josephson et al.

[11] Patent Number: 5,394,037
[45] Date of Patent: Feb. 28, 1995

[54] SENSE AMPLIFIERS AND SENSING METHODS

[75] Inventors: Gregg R. Josephson, Aloha, Oreg.; Mark E. Bauer, Cameron Park, Calif.

[73] Assignee: Lattice Semiconductor Corporation, Hillsboro, Oreg.

[21] Appl. No.: 42,533

[22] Filed: Apr. 5, 1993

[51] Int. Cl.$^6$ .............................................. H03F 1/08
[52] U.S. Cl. ..................................... 327/51; 327/544; 327/530
[58] Field of Search ...................... 307/530, 296.8, 605, 307/468, 279, 572, 575, 576, 585, 255, 254, 296.3; 365/196

[56] References Cited

U.S. PATENT DOCUMENTS

| | | | |
|---|---|---|---|
| 4,471,244 | 9/1984 | Maples | 307/530 |
| 4,504,748 | 3/1985 | Oritani | 307/530 |
| 4,833,646 | 5/1989 | Turner | 365/185 |
| 4,855,954 | 8/1989 | Turner et al. | 365/185 |
| 4,899,070 | 2/1990 | Ou et al. | 307/530 |
| 4,910,416 | 3/1990 | Salcone | 307/254 |
| 4,916,665 | 4/1990 | Atsumi et al. | 307/530 |
| 4,991,141 | 2/1991 | Tran | 307/530 |
| 5,099,138 | 3/1992 | Fukunaga | 307/254 |
| 5,140,199 | 8/1992 | Seo | 307/530 |
| 5,189,322 | 2/1993 | Chan et al. | 307/530 |
| 5,220,221 | 6/1993 | Caspere | 307/530 |
| 5,233,238 | 8/1993 | Mattos | 307/263 |

OTHER PUBLICATIONS

Seki et al., "An 80-ns 1-Mb Flash Memory with On-Chip Erase/Erase-Verify Controller", IEEE Journal of Solid-State Circuits, vol. 25, No. 5, Oct. 1990, pp. 1147 and 1149.

Baucom et al., "A 150 MHz CMOS EPLD with uW Standby Power", IEEE 1990 Custom Integrated Circuits Conference, pp. 31.6.1 and 31.6.3.

Primary Examiner—Timothy P. Callahan
Assistant Examiner—My-Trang Nu Ton
Attorney, Agent, or Firm—Skjerven, Morrill, MacPherson, Franklin & Friel

[57] ABSTRACT

A sense amplifier for sensing the impedance between two terminals includes an amplification stage whose input is connected to one of the terminals. The input is connected to a power supply voltage VCC through two transistors in parallel. One transistor provides a high speed by providing a large current when the voltage on the input is low. Moreover, to increase speed and save power, that transistor turns off when the amplification stage input voltage is slightly above the amplification stage trip voltage. The other transistor provides a small current to pull the amplification stage input up almost to VCC to reduce the amplification stage power consumption. The small current does not interfere significantly with the pull-down speed. One of the amplification stage power terminals is connected to ground through current limiting transistors to reduce the amplification stage power consumption when the amplification stage input voltage is at its low value which is slightly below the trip voltage. A reference voltage generator controls one of the two transistors connecting the amplification stage input to VCC so as to prevent the low value of the amplification stage input voltage from converging to the trip voltage over a wide range of the VCC and processing variations.

38 Claims, 6 Drawing Sheets

SENSE AMPLIFIERS AND SENSING METHODS

BACKGROUND OF THE INVENTION

The present invention relates to amplifiers, and more particularly to sense amplifiers that sense the impedance between two terminals.

Sense amplifiers that sense the impedance between two terminals are widely used in electronic devices. For example, in programmable logic devices (PLDs), an output signal based on whether or not a programmable cell has been programmed to a conductive state is derived from a sense amplifier which senses the impedance between cell terminals.

In a typical sense amplifier sensing the impedance between two terminals, the two terminals are connected to two different voltages so that the voltage on one or both of the terminals depends on the impedance between the two terminals. The voltage that depends on the impedance is connected to an input of an amplification stage that provides a high voltage swing on the amplifier output.

In many amplifiers, in order to obtain a high switching speed, the voltage on the input of the amplification stage is kept close to the stage trip voltage (i.e., threshold voltage). This, however, may lead to a high power consumption in the amplification stage if, for example, the amplification stage is implemented using CMOS technology. Further, the power supply voltage variations and processing variations can cause the voltages on the input of the amplification stage to converge to the stage trip voltage reducing the sense amplifier noise margin below an acceptable value.

Thus, it is desirable to provide a sense amplifier which combines a high speed with a low power consumption and which is more tolerant to supply voltage variations and processing variations.

SUMMARY OF THE INVENTION

The present invention provides in some embodiments a sense amplifier combining a high speed with a low power consumption. The amplifier is tolerant to the supply voltage variations and processing variations. These advantages are obtained in some embodiments as follows.

To sense the impedance between two terminals, say, T1 and T2, the two terminals are connected to two different voltages. For example, terminal T1 is connected to ground; terminal T2 is connected to an input of an amplification stage which is connected to power supply voltage VCC. When the impedance between the two terminals is low, the voltage on terminal T2 is low, and when the impedance is high, the voltage on terminal T2 is high.

The input of the amplification stage is connected to VCC by two transistors in parallel. One transistor, say, TR1, provides a high speed by providing a large current when the voltage on the input is low and a small current when the voltage is high. On the low-to-high transitions of the voltage on the input of the amplification stage, transistor TR1 pulls up the input slightly above the stage trip voltage. Then transistor TR1 shuts off. The other transistor connected between the input of the amplification stage and voltage VCC, say, transistor TR2, provides a small current to pull up the input almost to VCC shutting off the current through the amplification stage and thus reducing power consumption. The current through the feedback-controlled transistor TR2 is small not to interfere significantly with the speed of the high-to-low transitions.

When the voltage on terminal T2 is low, the voltage on the input of the amplification stage is kept only slightly below the amplification stage trip voltage in order to obtain a high speed. The current through the amplification stage is small, however, due to current limiting transistors connected to one of the amplification stage power terminals. More particularly, the amplification stage has two power terminals. One is connected to VCC. The other one is connected through a current limiting transistor to terminal T1. In some embodiments, for example, the amplification stage is a CMOS inverter in which the source of the PMOS transistor is connected to VCC and the source of the NMOS transistor is connected through the current limiting transistor to terminal T1. Terminal T1 is connected to ground through another current limiting transistor. Thus, two current limiting transistors in series connect the source of the NMOS transistor of the amplification stage to ground. The two transistors are controlled so as to reduce the current through the amplification stage to a low value when the amplification stage input voltage is slightly below the trip voltage. Hence, power consumption is low, while both the low-to-high and the high-to-low transitions are fast.

The voltage on the input of the amplification stage is controlled so as not to converge to the amplification stage trip voltage when the power supply voltage VCC and processing parameters vary within a wide range. Consequently, an acceptable noise margin is provided over a wide range of the VCC and processing variations.

Other features and advantages of the invention are described below. The invention is defined by the appended claims.

DESCRIPTION OF THE PREFERRED EMBODIMENTS

Figure 1:
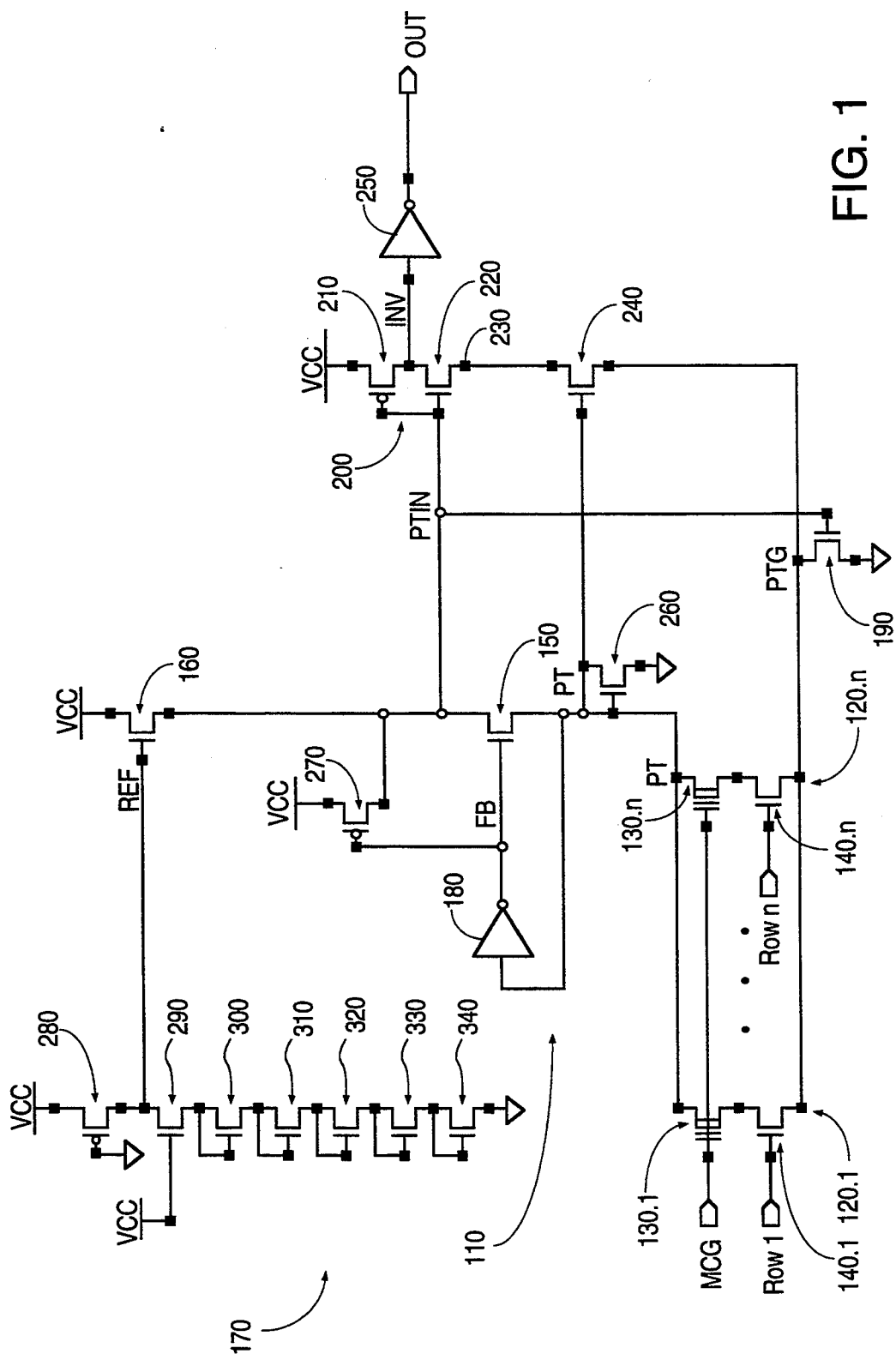
FIG. 1 is a circuit diagram illustrating a sense amplifier according to the present invention.

FIG. 1 illustrates a high speed, low power sense amplifier 110 for a programmable logic device (PLD). The PLD includes an array of "n" programmable cells 120.1 through 120.n where "n" can be any number greater than or equal to one. Each cell 120.i, where i can be any number from 1 to n, includes a floating gate sense transistor 130.i and an NMOS select transistor 140.i that are connected in series between terminals (or "nodes") PT ("product term") and PTG ("product term ground"). The control gates of all the sense transistors 130.i are connected to a terminal MCG ("matrix control gate"). The voltage on terminal MCG renders each sense transistor 130.i conductive or not depending on whether the sense transistor has been programmed to a conductive state. The gate of each select transistor 140.i is connected to a respective terminal Row.i. The signals on terminals Row.i are determined by the PLD input signals (not shown). If all the terminals Row.i are at a low voltage, or if one or more terminals Row.i are at a high voltage but the corresponding sense transistors 130.i do not conduct, the impedance between terminals PT and PTG is high. If the PLD input signals cause the voltage on one or more terminals Row.i to be high so as to turn on the corresponding select transistors 140.i, and if one or more of the corresponding sense transistors 130.i are conductive, a current path is formed between terminals PT and PTG to lower the impedance between the two terminals. PLD cells are described generally in the U.S. Pat. No. 4,855,954 issued Aug. 8, 1989 to Turner et al. and U.S. Pat. No. 4,833,646 issued May 23, 1989 to Turner. Both patents are hereby incorporated herein by reference.

Sense amplifier 110 provides on its terminal OUT a voltage indicative of the impedance between nodes PT and PTG. Sense amplifier 110 includes NMOS transistor 150 whose source is connected to node PT and whose drain is connected to the source of NMOS transistor 160. The drain of transistor 160 is connected to power supply voltage VCC. The gate of transistor 160 is connected to reference voltage generator 170 generating a voltage REF about equal to VCC on the gate of transistor 160.

Node PT is connected to the input of CMOS inverter-amplifier 180 whose output FB is connected to the gate of transistor 150. Node PTG is connected to ground through current limiting NMOS transistor 190 whose gate is connected to node PTIN at the drain of transistor 150.

Node PTIN is connected to the input of amplification stage 200 implemented as a CMOS inverter. Amplification stage 200 includes PMOS transistor 210 and NMOS transistor 220 whose gates are connected to node PTIN. The drains of transistors 210, 220 are connected to the amplification stage output node INV. The source of transistor 210 is a power terminal of stage 200 which terminal is connected to power supply voltage VCC. Node 230 at the source of transistor 220 is another power terminal of stage 200. Node 230 is connected to the drain of current limiting NMOS transistor 240 whose gate is connected to node PT and whose source is connected to node PTG.

Node INV is connected to the input of CMOS inverter 250 whose output is the sense amplifier output OUT.

Node PT is connected to the drain and the gate of NMOS clamp transistor 260 whose source is connected to ground.

When one or more cells 120.i conduct, they pull the voltages on nodes PT and PTIN down. Amplification stage 200 provides a high voltage on node INV, and the voltage on output OUT becomes low.

When all the cells 120.i are non-conductive, the voltage on node PTIN is high. Node INV is low, and the voltage on output OUT is high.

Node PT typically has a high capacitance as it is typically connected to a large number of cells 120.i.

Hence, to obtain a high speed, the voltage swing on node PT is restricted by clamp transistor 260 and current limiting transistor 190. Clamp transistor 260 prevents the voltage on node PT from becoming too high when all the cells 120.i are non-conductive. Current limiting transistor 190 prevents the voltage on node PT from becoming too low when one or more cells 120.i conduct.

Figure 2:
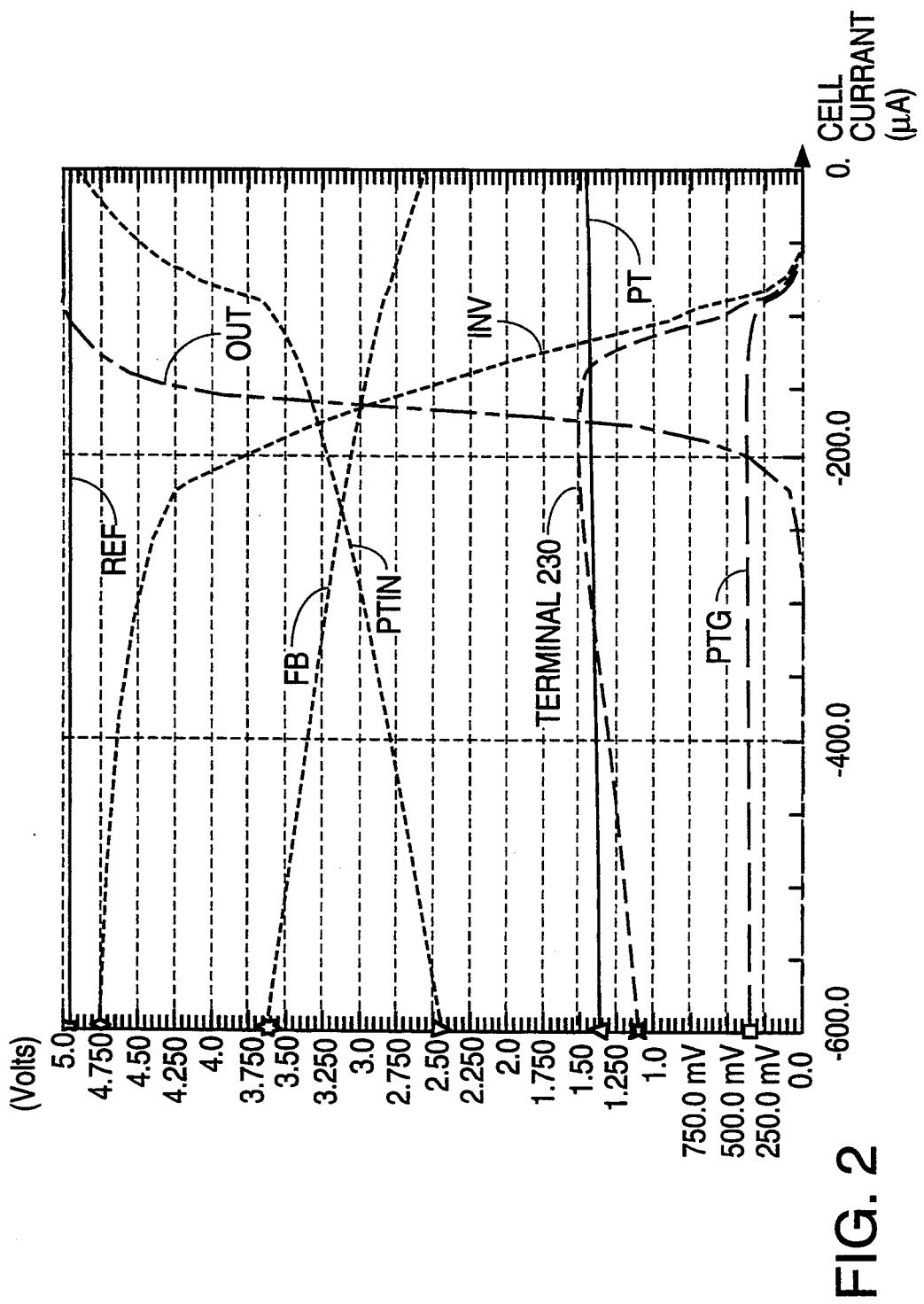
FIG. 2 is a computer simulation plot of voltages on some nodes of the sense amplifier of FIG. 1.

The computer simulation plot of FIG. 2 illustrates the voltage of node PT versus the current through cells 120.i in some embodiments. The current in FIG. 2 is shown as negative. In some embodiments, the select and sense transistors of cells 120.i and the current limiting transistor 190 are sized so that when one or more cells conduct, the current through the cells is about 275 $\mu$A. As illustrated by FIG. 2, when the cell current varies between 0 and 275 $\mu$A, the voltage on node PT varies by less than 0.1 V and stays close to 1.4 V which is the threshold voltage of clamp transistor 260.

As illustrated by the FB voltage plot in FIG. 2, the voltage on the output node FB of inverter 180 varies between about 3.2 V and about 2.5 V when the cell current varies between 0 and 275 $\mu$A. The amplifier formed by inverter 180 and by transistors 150, 160 and 260 amplifies the voltage on high-capacitance node PT to provide a larger voltage swing on lower-capacitance node PTIN.

Figure 3:
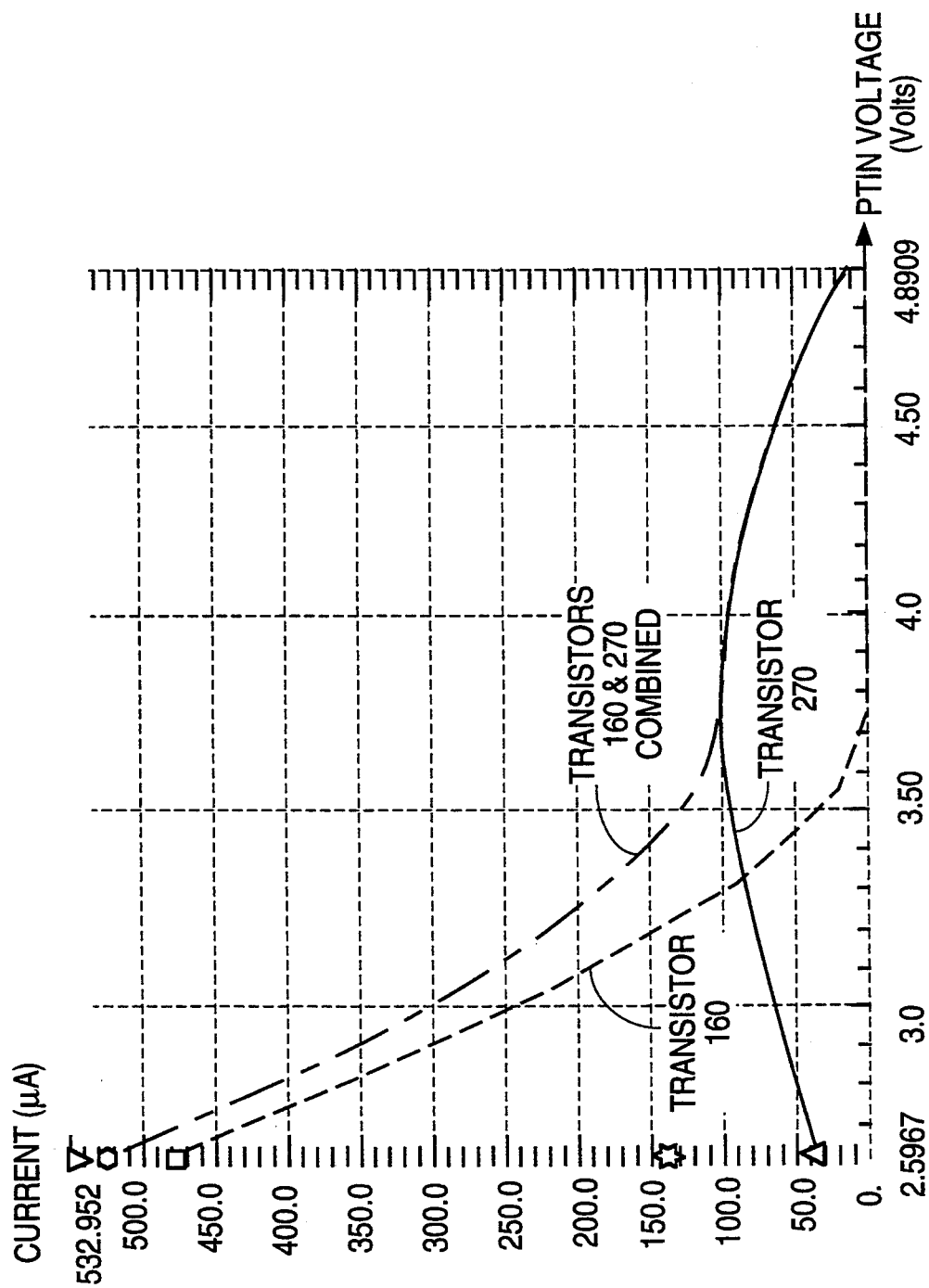
FIG. 3 is a computer simulation plot of some currents in the sense amplifier of FIG. 1.

NMOS transistor 160 provides fast switching on node PTIN in a power-efficient manner by providing a high current when the voltage on node PTIN is low and a low current when the voltage on node PTIN is high. The current through the current path provided by transistor 160 versus the voltage on node PTIN in some embodiments is plotted in FIG. 3. In some embodiments, transistor 160 is sized to keep node PTIN at about 3.0 V when the cell current is about 275 $\mu$A. As illustrated by FIG. 3, when node PTIN is at 3.0 V, the current through transistor 160 is about 230 $\mu$A. This current provides a fast pull-up of node PTIN when all the cells 120.i become non-conductive. As the voltage on node PTIN increases to the trip voltage of amplification stage 200, the current through transistor 160 decreases. The trip voltage is about 3.4 V in some embodiments. To provide a noise margin, transistor 160 continues pulling up node PTIN to the voltage REF-VTN where VTN is the threshold voltage of transistor 160. In some embodiments, REF=5.0 V and VTN=1.25 V. Thus, transistor 160 pulls up node PTIN to about 3.75 V, that is, only slightly above the trip voltage.

While pulling up node PTIN only slightly above the trip voltage is consistent with the goal of high speed, the power consumption by stage 200 is high when the PTIN voltage is 3.75 V because transistor 210 is on. Transistor 210 is on because the threshold voltage of transistor 210 is chosen to have a low magnitude of 0.7 V to provide a high gain for fast voltage switching on node INV. Of note, the FIG. 2 plots of the voltages on nodes PTIN and INV show that when the voltage on node PTIN is 3.75 V, the voltage on node INV is about 500 mV indicating that transistor 210 is on.

To reduce power consumption, PMOS transistor 270 pulls up node PTIN to about 4.9 V turning off transistor 210. The source of transistor 270 is connected to voltage VCC. The drain is connected to node PTIN. The gate is connected to node FB. The current through the current path provided by transistor 270 is plotted in FIG. 3. The current is small—not more than 100 $\mu$A—to allow a fast pull-down of node PTIN on the high-to-low transitions.

On the high-to-low transitions, the voltage on node FB increases to decrease the conductivity of transistor 270. Hence the current through transistor 270 remains small. The current through transistors 160 is also small when the voltage on node PTIN is above the 3.4 V trip voltage of stage 200. Thus, the combined current through transistors 160 and 270, which is also plotted in FIG. 3, is small, allowing a fast pull down and low power consumption. As the voltage on node PTIN decreases from 3.4 V to 3.0 V, the current through transistor 160 increases steeply to provide fast low-to-high transitions.

Since the gate of transistor 270 is controlled by the voltage generated to control the gate of transistor 150, no additional circuitry and power are needed to control the gate of transistor 270, which makes the pull-up through transistor 270 simple and power-efficient.

Transistors 240 and 190 help reduce the power consumed by amplification stage 200 when the voltage on node PTIN is at its low value of 3.0 V. More particularly, when the voltage on node PTIN decreases to 3.0 V, the voltage on node PTG increases to about 0.35 V. See the PTG voltage plot in FIG. 2. The voltage on node PTG increases because the cell current increases and because the voltage on the gate of transistor 190 decreases. At the same time, the voltage on node PT decreases to its low value near 1.4 V. Thus the gate-to-source voltage of transistor 240 decreases to about 1.4 V−0.35 V=1.05 V. The threshold voltage of transistor 240 is about 0.8 V, and the current through transistor 240 is only a few microamperes.

The voltage on power terminal 230 is then about 1.45 V. See the FIG. 2 plot of the voltage on terminal 230. The voltage on node INV is about 4.4 V. The voltage on output OUT is 0V as indicated by the output OUT voltage plot in FIG. 2.

On the low-to-high transitions, the voltage on node PT increases to allow more current through transistor 240. Further, at the beginning of the transition, the current through cells 120.i is shut off freeing transistor 190 to draw more current from transistor 240. Moreover, during the transition, the voltage on the gate of transistor 190 increases which increases the transistor conductivity allowing it to draw still more current from transistor 240. The increased current through transistor 240 facilitates fast pull-down of node INV. As the voltage on node PTIN increases to its high value, the voltage on power terminal 230 decreases to zero allowing a zero voltage to be provided on node INV. See FIG. 2.

Setting the low PTIN voltage value close to the 3.4 V trip voltage of stage 200 helps obtain a high speed on the low-to-high transitions.

Transistors 240 and 190 help reduce the sense amplifier dependence on VCC variations. In particular, when VCC increases, so does the voltage on node PTIN. Hence, if the source of transistor 220 were at the ground voltage, transistor 220 would conduct more current slowing down the increase of the trip voltage of stage 200. Consequently, the trip voltage could converge to the increasing low level of the PTIN voltage. The noise margin could decrease as a result.

In sense amplifier 110, transistors 240 and 190 limit the current through transistor 220. As a result, the trip point of stage 200 increases faster with VCC. Consequently, a high noise margin is provided over a wider range of VCC variations.

When the PTIN voltage is high, transistor 270 pulls the PTIN voltage to a value near VCC and thus far away from the trip voltage. The noise margin is high as a result.

Further, when the voltage on node PTIN is at its low level, transistor 240 is in saturation because its drain voltage—the voltage on node 230—exceeds its gate voltage which is the voltage on node PT. See FIG. 2. Hence the current through transistor 240 is largely independent from its drain-to-source voltage when the PTIN voltage is low. This independence limits the increase in the power consumption when VCC increases.

In some embodiments, the source of transistor 240 is connected to ground and not to terminal PTG. Transistor 240 in such embodiments limits the current through transistor 220 providing a high noise margin and a low power consumption even when VCC increases. When the PTIN voltage is low, the voltage on terminal 230 is above ground. The low voltage on node PT helps reduce the current through transistor 240.

When the voltage on node PTIN becomes high in such embodiments, transistor 210 turns off, and the voltage on terminal 230 becomes ground. Thus, whether the source of transistor 240 is connected to node PTG or ground, transistor 240 increases the effective voltage swing of node PTIN relative to node 230 at a given voltage swing of on node PTIN relative to ground. A low voltage swing of node PTIN relative to ground improves the sense amplifier speed, while a higher voltage swing of node PTIN relative to node 230 reduces power consumption.

Generating the voltage for the gate of transistor 240 does not require additional circuitry or power since the voltage is taken from node PT rather than from a reference voltage generation circuit.

In some embodiments, transistor 240 is absent, and terminal 230 is connected directly to node PTG. Transistor 190 limits the current through transistor 220 allowing the trip voltage of stage 200 to rise faster with VCC. Consequently, a high noise margin is maintained over a wide range of VCC variations. Transistor 190 allows achieving a lower power consumption even when VCC increases. Further, transistor 190 increases the effective voltage swing of node PTIN relative to node 230 at a given voltage swing of node PTIN relative to ground because when the voltage on node PTIN is low, transistor 190 causes the voltage on terminal 230 to be above ground.

Reference voltage generator 170 generates voltage REF on the gate of transistor 160 so as to make sense amplifier 110 reliable over a wide range of VCC and processing variations. Reference voltage generator 170 includes PMOS transistor 280 and a stack of NMOS transistors 290, 300, 310, 320, 330 and 340. The source of transistor 280 is connected to supply voltage VCC, and the gate is connected to ground. The drain is connected to the gate of transistor 160. The drain of transistor 290 is also connected to the gate of transistor 160. The gate of transistor 290 is connected to voltage VCC. The source is connected to the drain and the gate of transistor 300. The source of transistor 300 is connected to the drain and the gate of transistor 310. The source of transistor 310 is connected to the drain and the gate of transistor 320. The source of transistor 320 is connected to the drain and the gate of transistor 330. The source of transistor 330 is connected to the drain and the gate of transistor 340. The source of transistor 340 is connected to ground.

The channel width/length dimension of transistor 280 is 4 μm/6 μm in some embodiments, and the threshold voltage is about −0.8 V. The channel width/length dimension of each of transistors 290, 300, 310, 320, 330, 340 is 4 μm/0.7 μm in some embodiments, and the threshold voltage is about 0.8 V. Thus the stack of the six transistors 290, 300, 310, 320, 330, 340 turns on only when voltage REF is 0.8×6=4.8 V or higher. When VCC=5.0 V, voltage REF is almost 5.0 V (see the REF voltage plot in FIG. 2), and the NMOS stack is barely on. When VCC increases, REF increases slower than VCC limiting the low voltage level on node PTIN as illustrated in FIG. 4.

Because the gate of transistor 290 is kept at VCC rather than being connected to the drain of transistor 290, the voltage REF increases slower with VCC.

Figure 4:
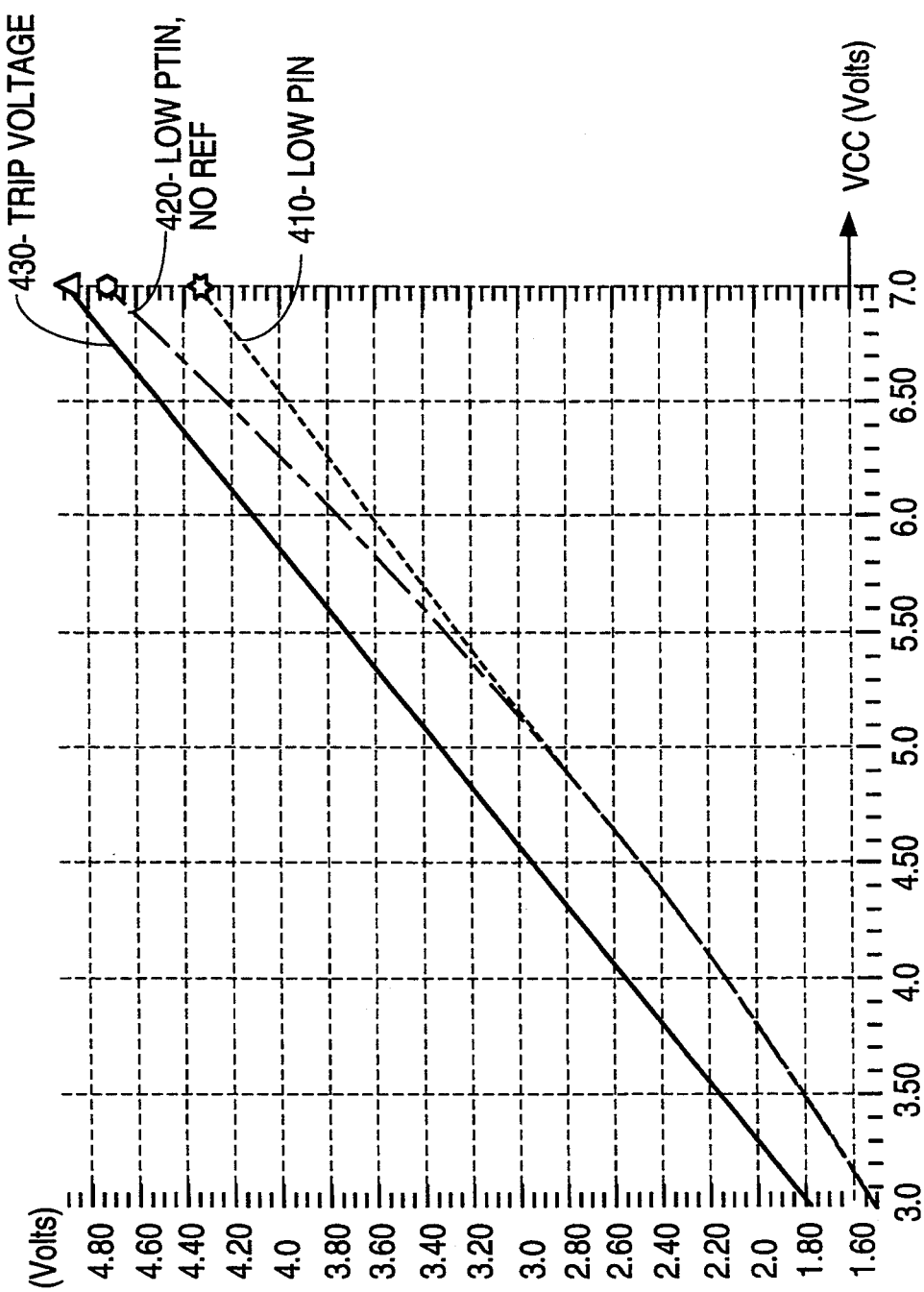
FIG. 4 is a computer simulation plot of some voltages versus VCC which plot illustrates a high noise margin over a wide range of the VCC variations in the sense amplifier of FIG. 1.

In FIG. 4, curve 410 is a plot of the low voltage on node PTIN versus VCC in sense amplifier 110. Curve 420 is a plot of the low voltage on node PTIN in a sense amplifier (not shown) in which the gate of transistor 160 is connected to VCC. Curve 430 is a plot of the trip voltage of stage 200. The trip voltage is adjusted by transistors 240, 220 and 190 as explained above.

When VCC=5.0 V or below, voltage REF is about equal to VCC, and the curves 410 and 420 almost coincide. As VCC increases, REF increases slower than VCC because of the pull-down current through NMOS transistors 290, 300, 310, 320, 330, 340. As a result, the low voltage on node PTIN in sense amplifier 110 (curve 410) increases sufficiently slowly not to converge to the trip voltage of stage 200 (curve 430). This means that the noise margin of the sense amplifier 110 remains high.

By contrast, curve 420 converges towards curve 430, representing a decreasing noise margin in the sense amplifier in which the voltage REF is replaced by VCC. As seen in FIG. 4, the noise margin of such an amplifier is reduced from about 0.4 V at VCC=5.0 V to about 0.2 V at VCC=7.0 V. By contrast, the noise margin of sense amplifier 110 is increased to about 0.6 V at VCC=7.0 V.

Figure 5:
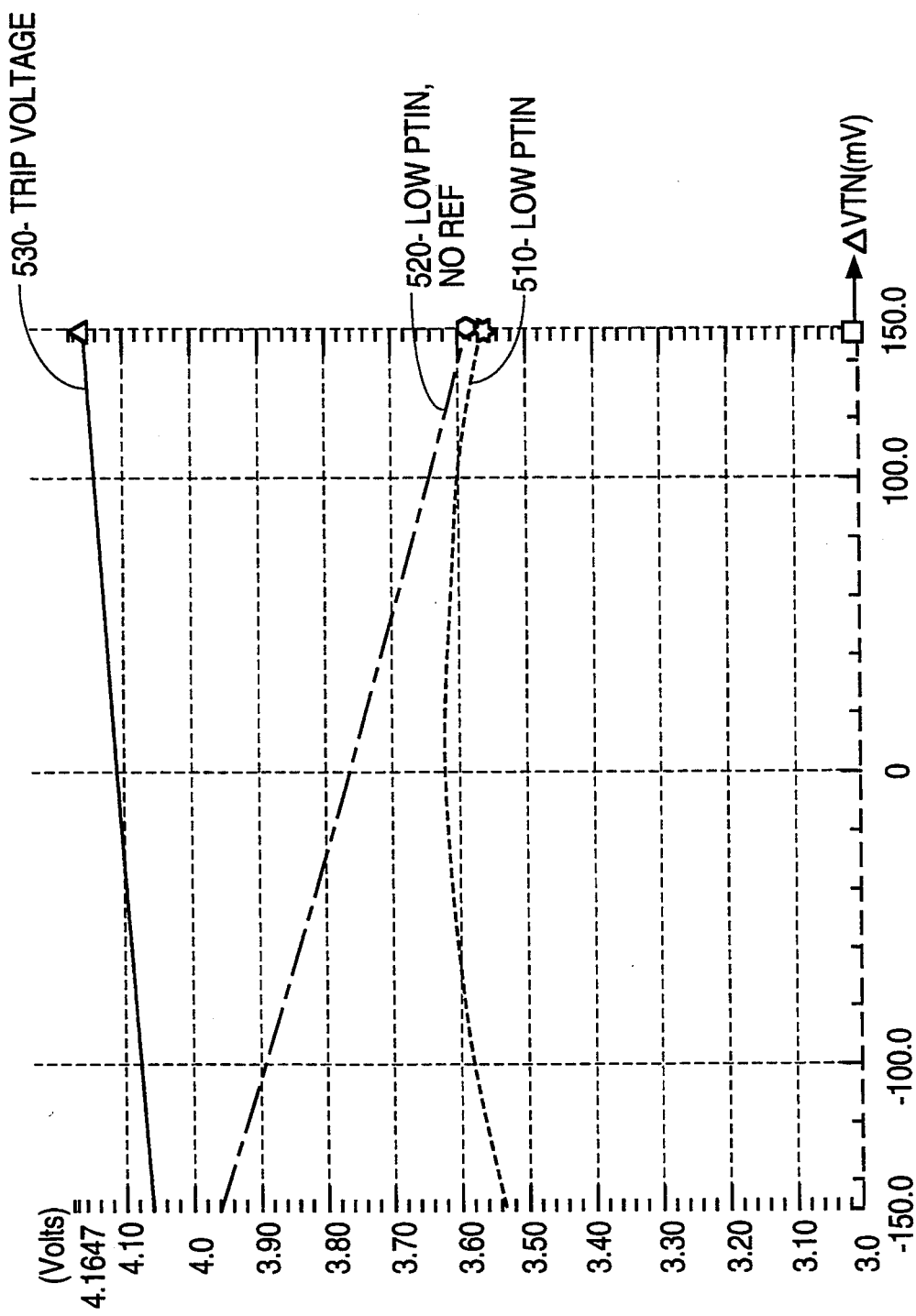
FIG. 5 is a computer simulation plot of the same voltages as in FIG. 4 but versus the NMOS transistors threshold voltage variations which are due to processing variations.

FIG. 5 illustrates the sense amplifier behavior over a range of processing variations that change the NMOS transistor threshold voltages VTN. The simulation plot of FIG. 5 assumes the VCC value of 6.0 V and the ambient temperature of 25° C. VTN variations ΔVTN are plotted on the horizontal axis. Curve 510 is a plot of the low voltage of node PTIN in sense amplifier 110. Curve 520 is a plot of the low voltage of node PTIN in the sense amplifier in which the gate of transistor 160 is connected to VCC. Curve 530 is a plot of the trip voltage of amplifier 200.

When ΔVTN approaches −150.0 mV, curve 520 converges to curve 530 indicating a noise margin reduction. By contrast, curve 510 does not converge to curve 530 indicating a high noise margin in sense amplifier 110.

Figure 6:
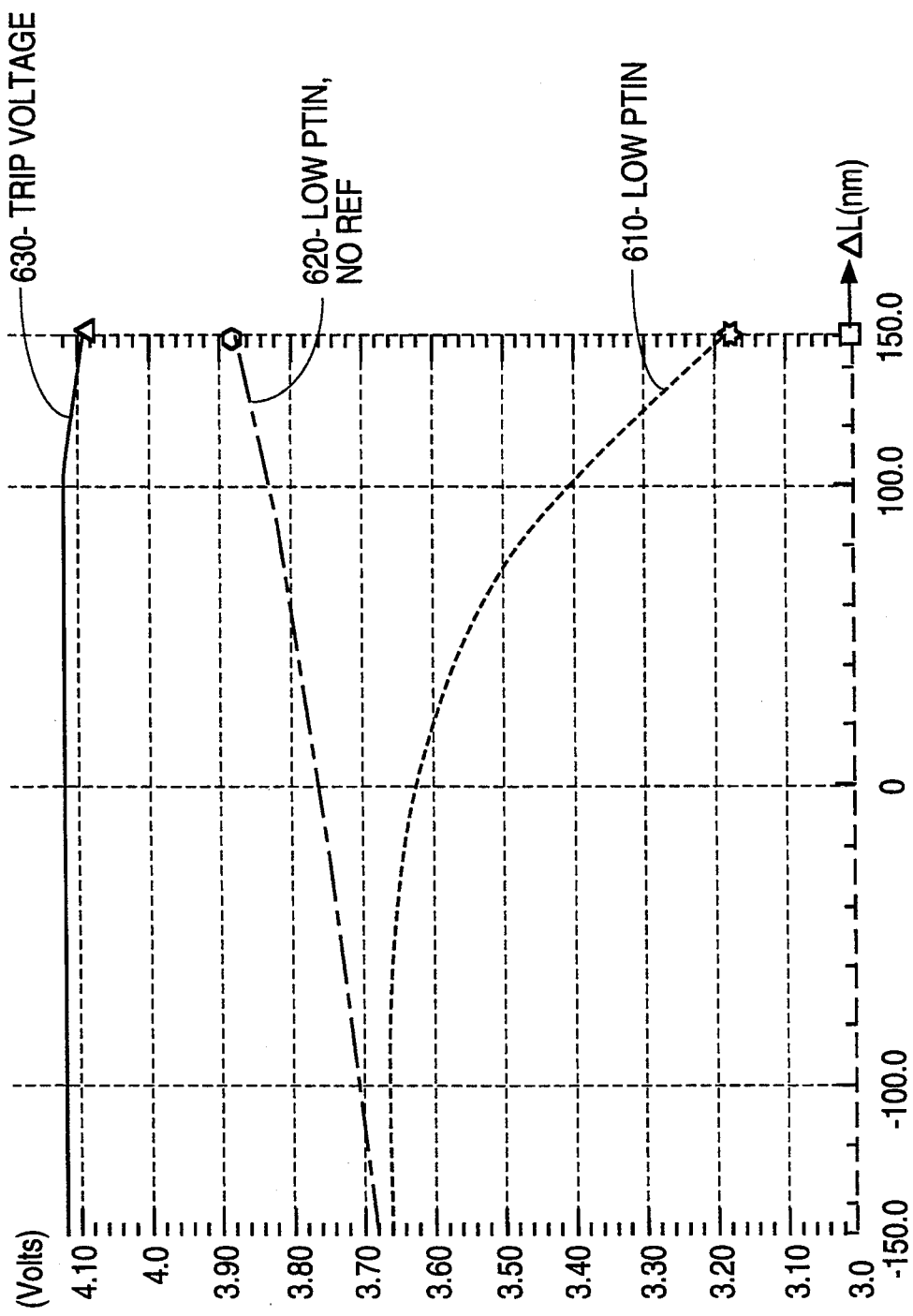
FIG. 6 is a computer simulation plot of the same voltages as in FIG. 4 but versus the transistors channel length variations which are due to processing variations.

FIG. 6 is a simulation plot of the trip voltage and the low PTIN voltages versus the processing parameter ΔL which is a variation of the transistor channel length L. The effective channel length is L-ΔL, where L is the nominal channel length. VCC is assumed to be 6.0 V, and the ambient temperature is assumed to be 25° C. Curve 610 illustrates the low PTIN voltage in sense amplifier 110. Curve 620 illustrates the low PTIN voltage in the sense amplifier in which the gate of transistor 160 is connected to VCC. Curve 630 illustrates the trip voltage.

When ΔL approaches 150.0 nm, curve 620 approaches the trip voltage curve 630 indicating a noise margin reduction. By contrast, curve 610 diverges from curve 630 indicating a high noise margin in sense amplifier 110.

The transistor channel width/length dimensions in micrometers in one embodiment of sense amplifier 110 are as follows. For transistor 280, the channel width/length dimension is 4/6; for each of transistors 290, 300, 310, 320, 330, 340, it is 4/0.7; for transistor 160, it is 7/1; for transistor 270, it is 4.5/1.2; for transistor 150, it is 10/1; for transistor 260, it is 3/2.5; for the PMOS transistor of inverter 180, it is 2/1.5; for the NMOS transistor of inverter 180, it is 8/1.5; for transistor 210, it is 10/0.8; for transistor 220, it is 4/0.7; for transistor 240, it is 30/0.7; for transistor 190, it is 4/1; for the PMOS transistor of inverter 250, it is 15/0.8; for the NMOS transistor of inverter 250, it is 3/0.7.

A typical threshold voltage of the NMOS transistors is about 0.7 V to 0.8 V. A typical threshold voltage of the PMOS transistors is about −0.8 V to −0.7 V. The actual threshold voltages depend on the back bias, the channel length and the drain voltage as is well known in the art.

While the invention has been illustrated with respect to the embodiments described above, other embodiments and variations are within the scope of the invention. In particular, the invention is not limited by the transistor channel dimensions and threshold voltages or by current and voltage values. In some embodiments, the ground is replaced by another voltage below or above VCC. In some embodiments, VCC is below ground. Some NMOS transistors are replaced by PMOS transistors and vice versa in some embodiments. Some embodiments include some but not all the features of sense amplifier 110 of FIG. 1. In particular, in some embodiments, the gate of transistor 160 is connected to VCC. In others, transistor 240 or transistor 190 or both are absent. Thus in some embodiments, terminal 230 and node PTG are at the ground voltage. The sense amplifier of the invention is suitable for impedance sensing in non-PLD circuits. In some amplifiers, transistor 150 is absent and terminal PT is connected directly to node PTIN. Other embodiments and variations are within the scope of the invention as defined by the following claims.

What is claimed is:

1. A sense amplifier for sensing an impedance between a first terminal of an electrical circuitry and a second terminal Of the electrical circuitry, said sense amplifier comprising:

means for connecting said first terminal to a voltage V1;

a node for having a voltage indicative of said impedance between said first and second terminals;

means for connecting said node to said second terminal and for thereby connecting said node voltage V1 through said circuitry and through said means for connecting said first terminal to the voltage V1, so that the voltage on said node depends on said impedance between said first and second terminals;

means M1 for providing a conductive path C1 between said node and a voltage V2 different from V1; and feedback means M2 connected to said node and said means M1, for controlling a current through said conductive path C1 so that, when said impedance between said first and second terminals decreases to cause the voltage on said node to move away from V2 towards V1, said means M2 increases an impedance of said conductive path C1 to reduce power consumption in said sense amplifier.

2. The sense amplifier of claim 1 further comprising an amplification stage A for amplifying the voltage on said node such that when the voltage on said node is at least as close to said voltage V2 as a predetermined voltage, said stage A consumes no power.

3. The sense amplifier of claim 1 wherein V1 is ground and V2 is a positive voltage.

4. A sense amplifier for sensing an impedance between a first terminal of an electrical circuitry and a second terminal of the electrical circuitry, said sense amplifier comprising:
   means for connecting said first terminal to a voltage V1;
   a node;
   means for connecting said node to said second terminal and for thereby connecting said node to said voltage V1 through said circuitry and through said means for connecting said first terminal to the voltage V1;
   means M1 for providing a conductive path C1 between said node and a voltage V2 different from V1;
   means M2 connected to said node and said for controlling a current through said conductive path C1 so that, when the voltage on said node moves away from V2 towards V1, said means M2 increases an impedance of said conductive path C1; and
   means for providing a conductive path C2 between said node and said voltage V2;
   wherein said conductive path C2 shuts off when the voltage on said node is at least as close to V2 as a predetermined voltage.

5. The sense amplifier of claim 4 further comprising an amplification stage A for amplifying the voltage on said node,
   wherein said predetermined voltage is between a trip voltage of said stage A and V2.

6. The sense amplifier of claim 4 wherein when the impedance between said first and second terminals decreases to a predetermined value, a current through said conductive path C2 exceeds in magnitude a current through said conductive path C1.

7. The sense amplifier of claim 6 wherein, when said impedance between said first and second terminals has said predetermined value, the current through said conductive path C2 is more than twice larger in magnitude than the current through said conductive path C1.

8. The sense amplifier of claim 4 wherein V1 is ground and V2 is a positive voltage.

9. A sense amplifier for sensing an impedance between a first terminal and a second terminal, said sense amplifier comprising:
   means for connecting said first terminal to a voltage V1;
   a variable-impedance device D1 having terminals T11 and T12 and having a control terminal CT1 for controlling a conductivity of a conductive path between the terminals T11 and T12;
   means for connecting said terminal T11 to said second terminal;
   means for connecting said terminal T12 to a voltage V2 different from V1; and
   means M1 for generating a reference voltage on said terminal CT1, said means M1 comprising:
   a transistor TR2 having terminals T21 and T22 and having a control terminal CT2;
   means for keeping said control terminal CT2 at said voltage V1;
   means for connecting said terminal T22 to said voltage V2; and
   means M2 for connecting said terminal T21 to said to voltage V1 and to said control terminal CT1.

10. The sense amplifier of claim 9 wherein:
    V2 is greater than V1; and
    said transistor TR2 is a PMOS transistor.

11. The sense amplifier of claim 9 wherein said means M2 comprises:
    a transistor TR3 having terminals T31 and T32 and having a control terminal CT3;
    means for keeping said control terminal CT3 at said voltage V2;
    means for connecting said terminal T32 to said control terminal CT1; and
    means for connecting said terminal T31 to said voltage V1, 12. The sense amplifier of claim 11 wherein:
    V2 is greater than V1; and
    said transistor TR3 is an NMOS transistor.

13. The sense amplifier of claim 9 wherein V1 is ground and V2 is a positive voltage.

14. A sense amplifier for sensing an impedance between a first terminal and a second terminal, said sense amplifier comprising:
    means for connecting said first terminal to a voltage V1;
    a variable-impedance device D1 having terminals T11 and T12 and having a control terminal CT1 for controlling a conductivity of a conductive path between said terminals T11 and T12;
    means for connecting said terminal T11 to said second terminal;
    means for connecting said terminal T12 to a voltage V2 different from V1; and
    means M1 for generating a reference voltage on said terminal CT1, said means M1 comprising:
    a transistor TR2 having terminals T21 and T22 and having a control terminal CT2;
    means for keeping said control terminal CT2 at said voltage V2;
    means for connecting said terminal T21 to said voltage V1; and
    means for connecting said terminal T22 to said control terminal CT1 and to said voltage V2.

15. The sense amplifier of claim 14 wherein:
    V2 is greater than V1; and
    said transistor TR2 is an NMOS transistor.

16. The sense amplifier of claim 14 wherein V1 is ground and V2 is a positive voltage.

17. A circuit for sensing an impedance between a first terminal of an electrical circuitry and a second terminal of the electrical circuitry, said circuit comprising:
    means for providing a conductive path between said first terminal and a voltage V1;
    a node;
    means connected to said node and said second terminal, for providing a conductive path between said node and said second terminal;
    means for providing a conductive path between said node and a voltage V2 different from V1;
    an amplification stage for amplifying a voltage on said node, said amplification stage having a first power terminal; and means for providing a conductive path between said first power terminal and said first terminal, wherein during operation of said circuit a voltage on said first terminal varies with the impedance between said first and second terminals.

18. The circuit of claim 17 wherein said amplification stage comprises:
   a first transistor TR1 having terminals T11 and T12 and a control terminal CT1;
   means for connecting said terminal T11 to said first power terminal;
   a transistor TR2 having terminals T21 and T22 and a control terminal CT2;
   a second power terminal;
   means for connecting said terminal T22 to said second power terminal;
   means for connecting said control terminals CT1 and CT2 to said node; and
   means for connecting said terminals T12 and T21 to an output of said stage.

19. The circuit of claim 18 wherein said means for providing a conductive path comprises a direct connection between said terminal T11 and said first terminal.

20. The circuit of claim 17 wherein said amplification stage further comprises a second power terminal, and said circuit further comprises means for providing a conductive path between said second power terminal and said voltage V2.

21. The circuit of claim 17 wherein:
   said amplification stage further comprises a second power terminal;
   when a voltage on said node moves towards a voltage on said first power terminal and away from a voltage on said second power terminal, a voltage on an output of said amplification stage moves towards the voltage on said second power terminal; and
   when the voltage on said, node moves towards V1 and away from V2, the voltage on said first power terminal moves towards V2.

22. The circuit of claim 17 wherein V1 is ground and V2 is a positive voltage.

23. A circuit for sensing an impedance between a first terminal of an electrical circuitry and a second terminal Of the electrical circuitry, said circuit comprising:
   a node;
   means for connecting said node to a voltage V2;
   means for connecting said node to said second terminal and for thereby connecting said node to said first terminal through said circuitry, so that, during operation of said circuit, a voltage on said node is closer to V2 and farther from a voltage V1 than a voltage on said second terminal;
   an amplification stage comprising:
      a variable-impedance device D1 having terminals T11 and T12 and a control terminal CT1;
      means for connecting said control terminal CT1 to said node; and
      means for connecting said terminal T12 to said voltage V2;
   means M1 for connecting said terminal, T11 and said first terminal to said voltage V1 so as to provide a variable-impedance conductive Bath C1 between said terminal T11 and said voltage V1, said means M1 having a control terminal CT such that when a voltage on said control terminal CT moves away from V2 towards V1, a conductivity of said conductive path C1 decreases; and means for keeping the voltage on said control terminal CT substantially equal to the voltage on said second terminal.

24. The circuit of claim 23 wherein said means M1 comprises:
   a transistor TR3 having terminals T31 and T32, said terminal CT being a control terminal of said transistor TR3;
   means for connecting said terminal T32 to said terminal T11;
   means for connecting said terminal T31 to said first terminal; and
   means for connecting said first terminal to said voltage V1.

25. The circuit of claim 23 wherein said means M1 comprises:
   a transistor TR3 having terminals T31 and T32, said terminal CT being a control terminal of said transistor TR3;
   means for connecting said terminal T32 to said terminal T11;
   means for connecting said terminal T31 to said voltage V1; and
   means for connecting said first terminal to said voltage V1.

26. The circuit of claim 23 wherein said means for connecting said terminal T12 to said voltage V2 comprises:
   a variable impedance device D2 having terminals T21 and T22 and a control terminal CT2;
   means for connecting said terminal T21 to said terminal T12;
   means for connecting said terminal T22 to said voltage V2; and
   means for connecting said terminal CT2 to said node.

27. The circuit of claim 23 wherein V1 is ground and V2 is a positive voltage.

28. A method for sensing an impedance between a first terminal of an electrical circuitry and a second terminal of the electrical circuitry, said method comprising the steps of:
   providing a current path CP1 between said first terminal and a voltage V1;
   providing a current between said second terminal and a voltage V2 different from V1 through a first current path; and
   providing a current between said second terminal and said voltage V2 through a second current path which has a common node with said first current path, so that:
      when said impedance between said first and second terminals increases to its highest value, the current through said second current path decreases to zero while the current through said first current path pulls a voltage on said common node to a predetermined value indicative of said highest value of said impedance; and
      when said impedance decreases from its highest value, the current through said second current path increases in magnitude and becomes greater in magnitude than the current through said first current path, wherein at least a portion of the current though the first and second current paths flows through said circuitry and said current path CP1.

29. The method of claim 28 wherein V1 is ground and V2 is a positive voltage.

30. A method for sensing an impedance between a first terminal of an electrical circuitry and a second terminal of the electrical circuitry, said method comprising the steps of:
- connecting a node connected to said second terminal to a voltage V2, and connecting said first terminal to a voltage V1 different from V2 thereby connecting said node to said voltage V1 through said circuitry and said first terminal, to provide on said node a voltage indicative of said impedance between said first and second terminals, the voltage on said node being between V1 and V2;
- amplifying the voltage on said node by an inverting amplification stage having a power terminal PT1; and
- during amplifying, providing a variable-impedance conductive path between said terminal PT1 and said voltage V1 such, that when said impedance between said first and second terminals decreases to cause the voltage on said node to move away from V2 towards V1, a voltage on said power terminal PT1 moves away from V1 towards V2 to decrease a magnitude of a current through said amplification stage.

31. The method of claim 30 wherein V1 is ground and V2 is a positive voltage.

32. The method of claim 30 wherein when said impedance between said first and second terminals increases to cause the voltage on said node to move away from V1 towards V2, the voltage on said power terminal PT1 moves away from V2 towards V1 to facilitate a fast pull of the voltage on an output of said amplification stage towards V1.

33. A sense amplifier for sensing an impedance between a first terminal and a second terminal, said sense amplifier comprising:
- a transistor T1 for connecting said first terminal to a reference voltage;
- a transistor T2 having a terminal T21 connected to said second terminal and having a terminal T22;
- a transistor T3 for connecting said terminal T22 to a power supply voltage;
- a transistor T4 for connecting said terminal T22 to said power supply voltage;
- a PMOS transistor T5 having a gate connected to said terminal T22;
- an NMOS transistor T6 having a gate connected to said terminal T22 and a drain connected to a drain of said transistor T5; and
- a transistor T7 having a terminal connected to a source of said NMOS transistor T6.

34. The sense amplifier of claim 33 further comprising an inverter having an input connected to said second terminal and an output connected to a gate of said transistor T3.

35. The sense amplifier of claim 34 further comprising:
- a PMOS transistor T8 for connecting a gate of said transistor T4 to said power supply voltage;
- means for connecting a gate of said transistor T8 to said reference voltage;
- an NMOS transistor T9 for connecting the gate of said transistor T4 to said reference voltage; and
- means for connecting a gate of said transistor T9 to said power supply voltage.

36. The sense amplifier of claim 35 wherein said transistor T7 is connected between said source of said NMOS transistor T6 and said first terminal, and a gate of said transistor T7 is connected to said second terminal.

37. The sense amplifier of claim 36 wherein a gate of said transistor T1 is connected to said terminal T22.

38. The sense amplifier of claim 37 further comprising a transistor connected between said second terminal and said reference voltage and having a gate connected to said second terminal.

* * * * *